United States Patent [19]

Pfiffner

[11] Patent Number: 5,508,620
[45] Date of Patent: Apr. 16, 1996

[54] METHOD AND DEVICE FOR DETERMINING GROUND FAULTS ON THE CONDUCTORS OF AN ELECTRICAL MACHINE

[75] Inventor: Michael Pfiffner, Bonstetten, Switzerland

[73] Assignee: ABB Management AG, Baden, Switzerland

[21] Appl. No.: 279,879

[22] Filed: Jul. 26, 1994

[30] Foreign Application Priority Data

Sep. 1, 1993 [DE] Germany .......................... 43 29 382.4

[51] Int. Cl.[6] .............................. G01K 31/34; H02H 7/06
[52] U.S. Cl. ........................ 324/545; 324/510; 324/511; 324/772; 340/650; 361/42
[58] Field of Search ..................................... 324/509, 510, 324/511, 545, 772; 340/650; 361/42, 46, 50

[56] References Cited

U.S. PATENT DOCUMENTS

| | | | |
|---|---|---|---|
| 4,224,652 | 9/1980 | Fiorentzis | 324/545 |
| 4,542,468 | 9/1985 | Taniguti | 324/510 |
| 4,580,186 | 4/1986 | Parker et al. | 361/42 |
| 4,667,262 | 5/1987 | Maier | 361/42 |
| 4,884,023 | 11/1989 | Schmidt et al. | 324/545 |
| 5,365,179 | 11/1994 | Rogers | 324/509 |

FOREIGN PATENT DOCUMENTS

| | | |
|---|---|---|
| 0131718 | 1/1985 | European Pat. Off. . |
| 3634802 | 4/1988 | Germany . |
| 3928551 | 3/1991 | Germany . |
| 970546 | 10/1982 | U.S.S.R. . |
| 1169064 | 7/1985 | U.S.S.R. . |
| 1601236 | 10/1981 | United Kingdom . |

OTHER PUBLICATIONS

CH–ES 63–25 11 D Ausgabe, "100% Stator–Und Rotor–Erdschlussschutz Fur Grosse Generatoren Gix 104", 9 pages, Jan. 1988.
Relais un Schutztechnik CH ES 63–23 D, "100%–Iger Genreator–Statorerdschluss–Schutz Gix 103", 10 pages. Date unavailable.
Siemens–Energietechnik, 1, H.11, vgl.S.409, Von Klaus Henninger, et al., "Zweistufiger Laufererdschlussschutz Hoher Empfindlichkeit Fur Synchronmaschinen", pp. 407–411, 1979. Month unavailable.
Grundlagen, Stand der Technik Neuentwicklungen, H. Ungrad, et al., "Schutztechnik In Elektroenergiessystemen", pp. 210–215, 1991. Month unavailable.
BBC AG Brown, Boveri & CIE, vgl. S.3 CH–ES 63–23.1 D, Baden/Schweiz, "100% Stator–Und Rotor–Erdschlussschutz Fur Grosse Generatoren GIX104", pp. 1–8, Jan. 1988.

Primary Examiner—Kenneth A. Wieder
Assistant Examiner—Diep Do
Attorney, Agent, or Firm—Oblon, Spivak, McClelland, Maier & Neustadt

[57] ABSTRACT

A method is specified for detecting ground faults on the conductors of electrical machines, in which method the fault resistance (Rf) is directly calculated in a numerical evaluation unit (7) from the injected (Ui) and the measured (URE) voltages. Since the fault resistance is explicitly calculated and displayed, it is independent of influences from the ground reactance. Moreover, there is no need to, for each machine, characteristics for drawing conclusions on the fault resistance. Moreover, the influence of ageing, temperature fluctuations, injection level fluctuations etc. is eliminated due to the numerical calculation. (FIG. 1a)

6 Claims, 3 Drawing Sheets

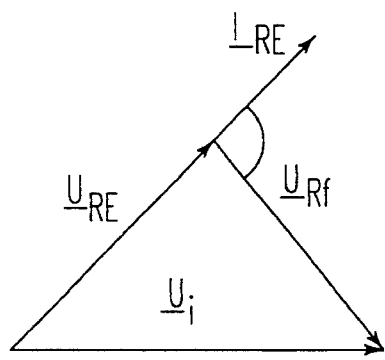
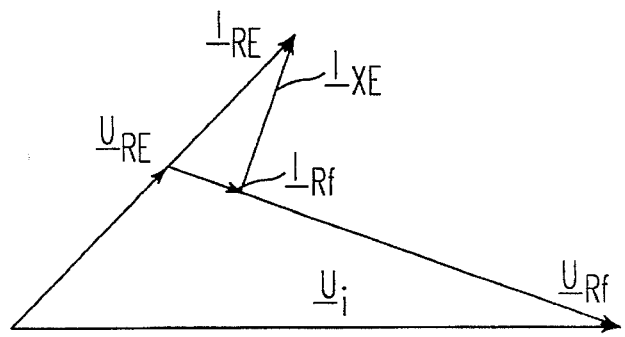
FIG. 2a    FIG. 2b
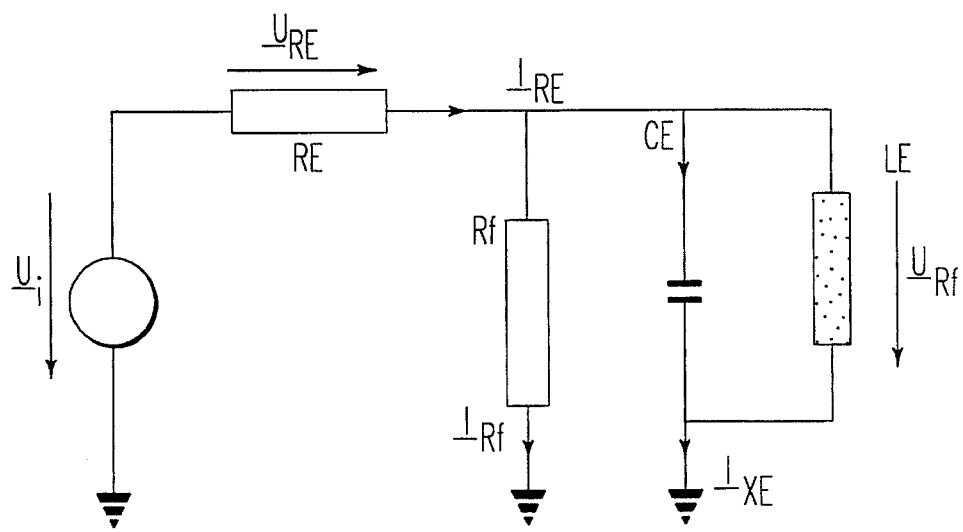
FIG. 3a
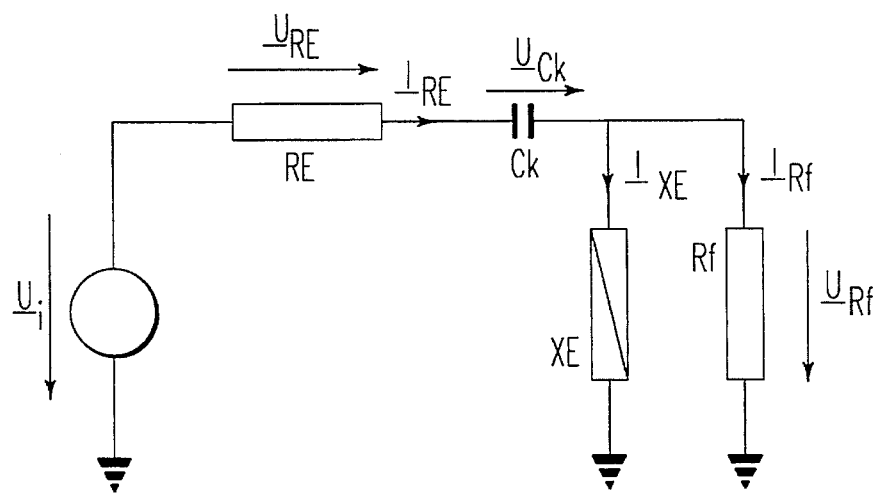
FIG. 3b

METHOD AND DEVICE FOR DETERMINING GROUND FAULTS ON THE CONDUCTORS OF AN ELECTRICAL MACHINE

BACKGROUND OF THE INVENTION

1. Field of the Invention

The invention relates to the field of protective relaying.

In particular, it relates to a method for detecting ground faults on the conductors of an electrical machine

2. Discussion of Background

Such a method is described, for example, in the equipment description "100% stator and rotor ground-fault protection for large GIX 104 generators" ABB Relays AG, Baden. A related method is described in the equipment description "100% generator/stator ground-fault protection GIX 103" from the same company.

Ground faults occur in an electrical machine, in particular ;in generators of relatively high output, chiefly due to mechanical damage to the insulation between the conductors and iron parts. Such ground faults cause the flow of a fault current whose magnitude assumes different values depending on the type of fault. Given a known voltage, a fault resistance can be determined therefrom using Ohm's law, the magnitude of which can be used to assess the fault. In the normal case, the fault resistance has values in the region of MΩ, while in the event of faults it can drop to values which are smaller by orders of magnitude.

Since the star point in the conductors, for example of the stator of a generator, connected in star is de-energized by definition, a fault can be detected in the vicinity of the star point only if the conductors are biased with respect to ground potential. This is performed in the case of two known protective devices and methods by means of a low-frequency voltage which is fed into the conductors.

A small current flows to ground during operation through the ground reactances of the conductors. In the event of a ground fault, these reactances are short circuited, and the current becomes larger than during operation in the absence of ground faults. In the GIX 103, use is made of an injection signal whose phase position remains unchanged. It is disadvantageous in this method, however, that a current circulating via the capacitors of the rotor circuits can occur which has the same frequency as that of the injection voltage. This can give rise to erroneous indications.

An attempt is made to avoid this in the GIX 104 by switching the phase of the injection voltage back and forth continuously between two values. It is possible in this way precisely to distinguish a fault current from other currents.

However, it is a common feature of both protective devices that the fault resistance can be determined subsequently only with the aid of empirical values or with the aid of recorded characteristics which are different for each machine. In addition, the measurement of the fault current is influenced by ageing, temperature, fluctuations in the injection voltage level, etc. The two systems additionally have the known shortcomings which are inherent to analog systems.

SUMMARY OF THE INVENTION

Accordingly, one object of this invention is to provide a novel method and a novel device for detecting ground faults on the conductors of an electrical machine, in which the disadvantages of the known analog methods can be avoided.

This object is achieved in a method of the type mentioned at the beginning by means of the features of the first claim.

The core of the invention is thus that the measuring signal is numerically evaluated, that is to say a ground fault resistance is calculated directly in an evaluation unit from the injected voltage and the measured voltage.

A first exemplary embodiment is distinguished in that the conductors of the electrical machine are the stator windings, for example of a generator, which are connected in star. The injection signal biases the star point of the winding with respect to the ground potential. The fault resistance can now be calculated with the aid of the measured and the injected voltages. The calculation becomes particularly simple when it is performed vectorially in a coordinate system rotating at the injection frequency.

A second exemplary embodiment is distinguished in that the conductors are the rotor windings, for example of a generator. In this case, the injection voltage is fed into the conductors via two coupling capacitors. The calculation of the fault resistance is performed vectorially, as in the first exemplary embodiment.

In addition, one device each for carrying out the method is specified for these two exemplary embodiments. One transformer each is provided for injection and for measurement. The injection signal is fed into the conductors via a coupling resistor and, in the case of the rotor, additionally via coupling capacitors. The measurement is performed via a reference resistor by means of a measuring transformer. Finally, a numerical evaluation unit is provided for the evaluation. The calculation of the fault resistance is performed in this evaluation unit using the formulae specified.

Further exemplary embodiments follow from the subclaims.

The advantage of the design according to the invention consists in particular in that the fault resistance can be calculated directly from the measured and the injected voltages. No more characteristics need be determined, and the calculated value is independent of the ground reactance and of the amplitude of the injection signal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2a,b show the vector diagrams of the currents and voltages for the stator; and FIGS. 3a,b show the equivalent circuit diagrams in the case of a ground fault in the stator (a) and rotor (b), respectively.

Figure 1B:
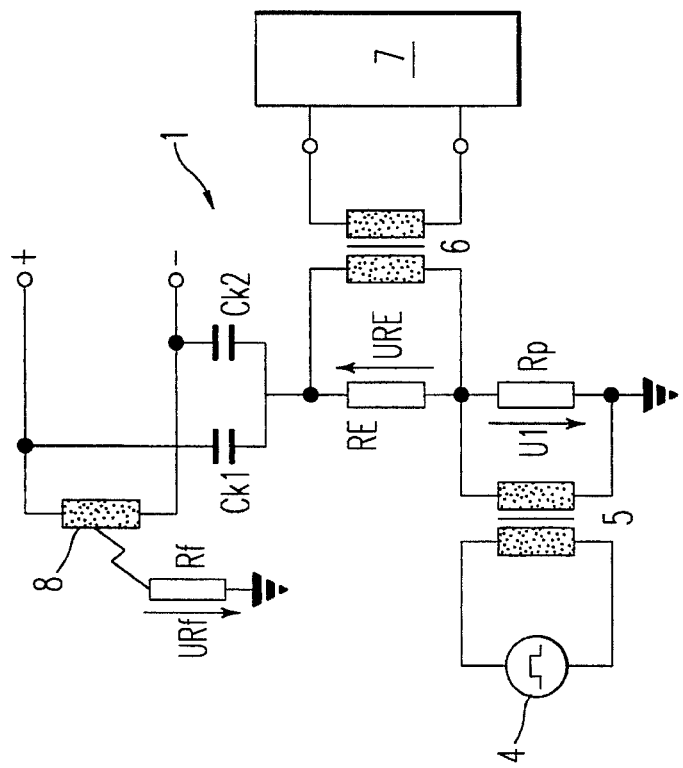
FIGS. 1a,b,c,d show the principle of the circuit arrangement for ground-fault detection at the stator (a) and rotor (b), respectively, of three-phase machine.

The reference signals used in the drawings are listed in summary together with their significance in the list of designations.

DESCRIPTION OF THE PREFERRED EMBODIMENTS

In the following, the method according to the invention and the device are explained by way of example with the aid of a three-phase machine, in particular a generator. However, the invention is not limited to generators, but can be used for electrical machines in general such as, for example, transformers, as well.

Figure 1A:
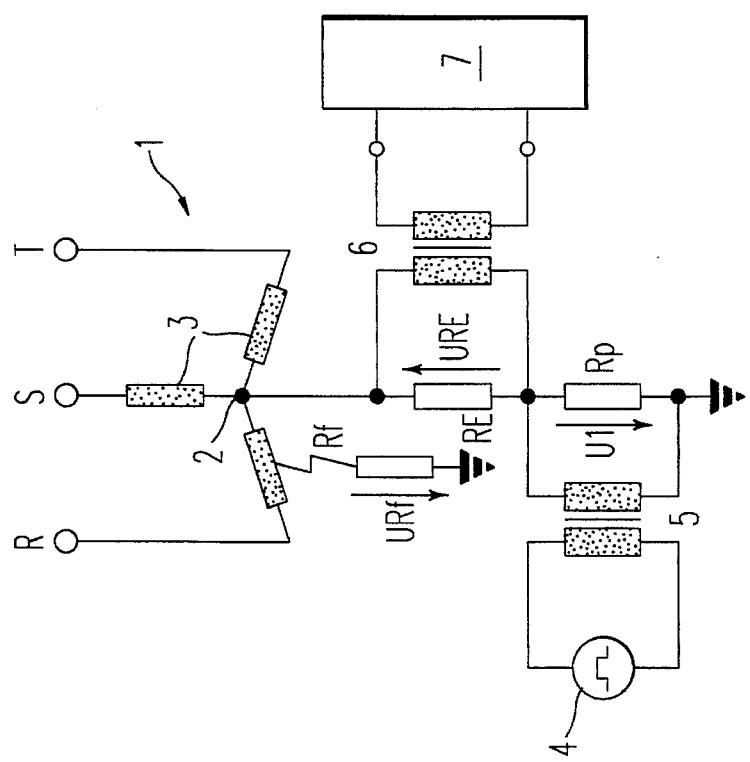

Referring now to the drawings, wherein like reference numerals designate identical or corresponding parts throughout the several views, FIG. 1a shows the principle of the circuit arrangement for detecting ground faults on the stator windings (R,S,T) of a three-phase machine. The stator windings are connected in star and are grounded with the parallel resistor (Rp) via a grounding resistor (RE). In order for it to be possible to detect ground faults on the entire winding, the star point of the winding is biased by means of an injection signal (Ui). This injection signal (Ui) is generated in an injection signal source (4) and fed into the star point (2) via an injection transformer (5) and a grounding resistor (RE). In order to detect ground faults, the voltage (URE) across the grounding resistor (RE) is measured and fed to an evaluation unit (7) via a measuring transformer (6). The fault resistance (Rf) is calculated in the evaluation unit (7) with the aid of the injected (Ui) and the measured voltage.

FIG. 3a shows the equivalent circuit diagram of the circuit arrangement according to FIG. 1. The injection voltage (Ui) is represented as an ideal voltage source. The reference resistor (RE) is present between the fault resistance (Rf) and the ground reactance (XE) of the starer. The ground reactance is formed from a parallel circuit of a ground capacitance (CE) and a ground inductance (LE). In the normal case, the fault resistance has an infinitely large value. However, due to mechanical defects it can drop, and current can thus flow.

The associated vector diagrams are represented in FIGS. 2a,b. The following discussion is based on a vectorial approach in a coordinate system rotating at the frequency (f1) of the injection signal. That is to say, only the first harmonic of the spectrum of the injection signal (Ui) is considered. Underlined variables always signify below vectors which rotate at the frequency (f1).

In the normal case (FIG. 2a), no current flows through the fault resistance, with the result that the current through the ground inductor (IXE) is precisely at right angles to the corresponding voltage (URf). In the case of a ground fault, the current through the fault resistance (Rf) is no longer zero. Consequently, the total current (IRE) is composed of a reactive (IXE) and an ohmic (IRf) component, and the voltage (URf) varies correspondingly. It holds in accordance with Kirchhoff that:

$$\underline{U}_{Rf} = \underline{U}_i - \underline{U}_{Rg}$$

The current (IRE) which flows to ground through Rf and CE is proportional to the voltage URE:

$$\underline{I}_{RE} = \frac{\underline{U}_{RE}}{R_E}$$

This current can be divided into two orthogonal components IRf and IXE. IRf is parallel in this case to URf. Consequently, the absolute value of IRf, that is to say IRf can be calculated as the scalar product of the current IRE and of the unit vector in the direction of URf:

$$I_{Rf} = \frac{\underline{I}_{RE} * \underline{U}_{Rf}}{U_{Rf}} \quad * = \text{Scalar product}$$

and so:

$$R_f = \frac{U_{Rf}}{I_{Rf}} = \frac{U_{Rf}^2}{(\underline{I}_{Rf} * \underline{U}_{Rf})} = R_E \frac{(\underline{U}_i - \underline{U}_{RE})^2}{\underline{U}_i * \underline{U}_{RE} - U_{RE}^2}$$

or in components:

$$R_f = R_E \cdot \frac{(U_{ix} - U_{REx})^2 + (U_{iy} - U_{REy})^2}{U_{ix} \cdot U_{REx} + U_{iy} \cdot U_{REy} - (U_{REx}^2 + U_{REy}^2)}$$

As may easily be seen from the formula, the fault resistance is independent of the ground reactance and depends only on the injected voltage (Ui) and the measured voltage (URE). It is thus no longer necessary to record a separate characteristic for each machine. Rather, the above formula can be used as an algorithm for calculating the fault resistance. It is, however, to be borne in mind that this measurement principle functions only if the injection voltage is the sole source of frequency f1. Consequently, the system is continuously tested for interfering f1 components during injection pauses. If the f1 components exceed a specific value, the preceding calculation of the fault resistance is discarded.

The conditions are not substantially different in the rotor. The only extra is two coupling capacitors (Ck1, Ck2), if necessary. FIG. 1b shows the corresponding circuit diagram. The equivalent circuit diagram is yielded as the arrangement represented in FIG. 3b.

A procedure exactly as for the stator can be adopted to calculate the fault resistance, all that is required being to replace the voltage URE according to the equivalent circuit diagram in the numerator by (URE+UCK):

$$R_f = R_E \cdot \frac{(U_{ix} - U_{REx} - U_{CKx})^2 + (U_{iy} - U_{REy} - U_{CKy})^2}{U_{ix} \cdot U_{REx} + U_{iy} \cdot U_{REy} - (U_{REx}^2 + U_{REy}^2)}$$

A periodic square wave is preferably used as injection signal (Ui). If the injection signal (Ui) is, in addition, cyclically interrupted and pauses of a few periods are inserted, it is possible to prevent transient processes from causing erroneous triggering.

The method according to the invention thus comprises the following steps:

injection of the voltage $\underline{U}_i$, measurement of the voltage $\underline{U}RE$, with UCk in addition in the case of the rotor, division of the injected and measured voltages ($\underline{U}_i$ and URE, UCk) into orthogonal components (Uix, Uiy and UREx, UREx, UREy, possibly UCKx, UCKy), and calculation of the fault resistance in accordance with:

$$R_f = R_E \cdot \frac{(U_{ix} - U_{REx})^2 + (U_{iy} - U_{REy})^2}{U_{ix} \cdot U_{REx} + U_{iy} \cdot U_{REy} - (U_{REx}^2 + U_{REy}^2)}$$

and $$R_f = R_E \cdot \frac{(U_{ix} - U_{REx} - U_{CKx})^2 + (U_{iy} - U_{REy} - U_{CKy})^2}{U_{ix} \cdot U_{REx} + U_{iy} \cdot U_{REy} - (U_{REx}^2 + U_{REy}^2)}$$

respectively.

The devices for carrying out the method have an injection signal source (4) which is connected, for example, via an injection transformer (5), a parallel resistor (Rp) and a ground resistor (RE) to the star point (2) of the stator windings, on the one hand, and to the coupling capacitors (Ck1, Ck2) of the rotor winding, on the other hand. The injection signal (Ui) is fed into the conductors via this arrangement. In addition, a measuring transformer is provided in parallel with the ground resistor (RE). The output of said transformer is connected to the evaluation unit (7). A check is made periodically in the evaluation unit (7) as to whether a ground fault is present or not. This is performed by calculating the fault resistance (Rf) with the aid of the above formulae. If the fault resistance undershoots a specific, freely settable threshold, an alarm signal is immediately activated.

Figure 1C:
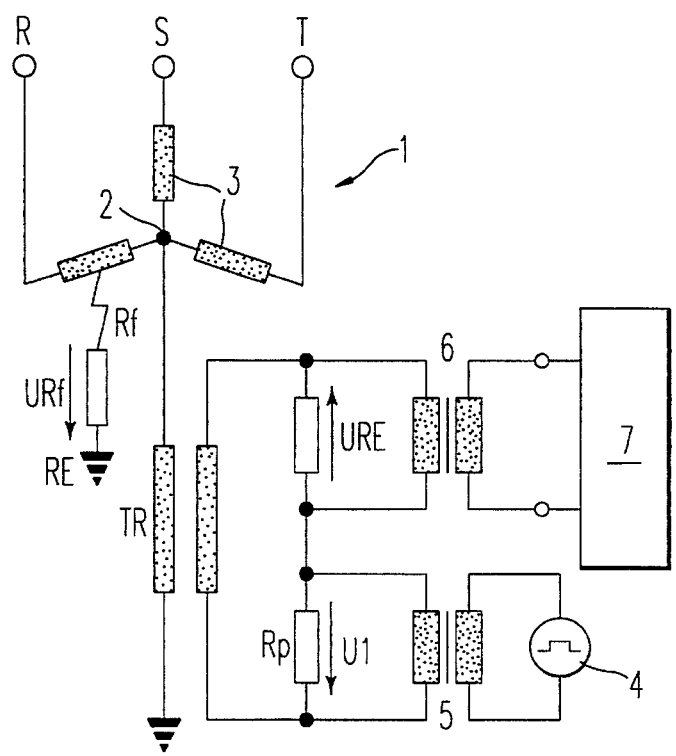
Figure 1D:
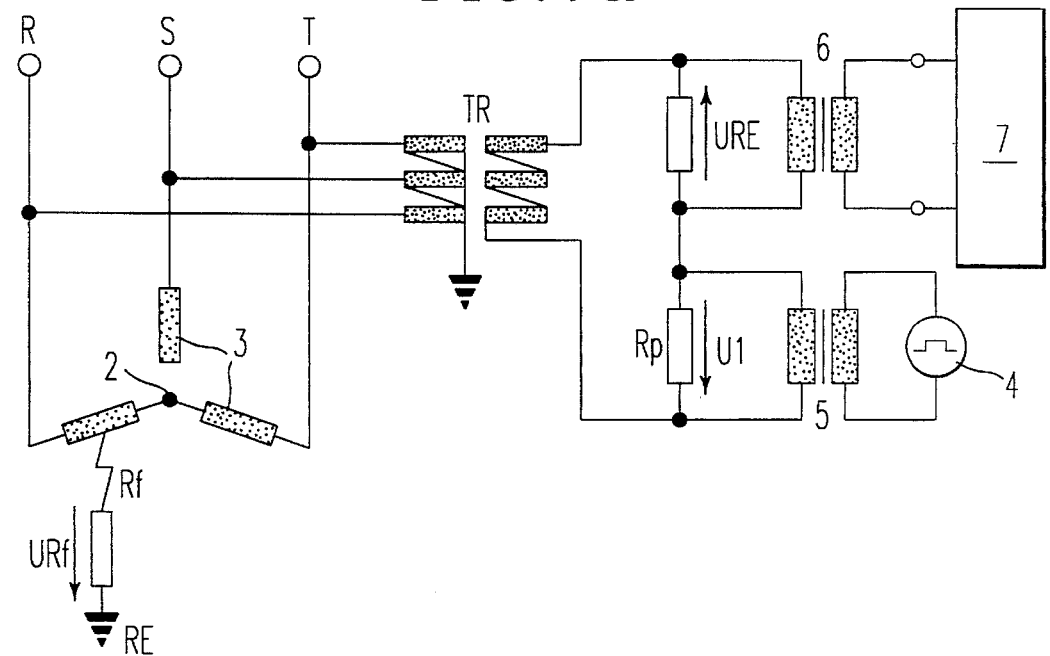

However, the method can also be used for other ways of feeding in the injection signal. Thus, for example, it can also be used for the so-called secondary injection method, in which the ground or parallel resistors are connected via a transformer to the star point (FIG. 1c). A further variant (FIG. 1d) is distinguished in that the injection signal is fed directly into the conductors via a multiphase transformer. This variant is used, in particular, in machines in which the star point is not accessible.

Overall, the invention thus makes available a method for detecting ground faults in which the fault resistance can be continuously calculated and directly displayed without having to use specially measured curves. In addition, the calculation of the fault resistance is independent of the ground reactance, the magnitude of the injection level and possible ageing effects.

The method according to the invention thus provides a more reliable and more accurate protection against ground faults.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for detecting ground faults on conductors of an electrical machine, the method comprising the steps of:

a) biasing the conductors with respect to ground potential by means of a low-frequency injection voltage $U_i$ of frequency $f_1$, and measuring and evaluating a measuring voltage $U_{RE}$ via a ground resistor $R_E$ connected to the conductors;

b) calculating a ground fault resistance $R_f$ from the injection voltage $U_i$ and the measuring voltage $U_{RE}$, and numerically displaying said ground fault resistance $R_f$ in a numerical evaluation unit connected to the measuring voltage; the conductors being the stator windings of said electrical machine connected in star;

c) dividing the injected and measured voltages $U_i$ and $U_{RE}$ in the evaluation unit into orthogonal components $U_{ix}$, $U_{iy}$, and $U_{REx}$, $U_{REy}$, respectively; and d) calculating the ground fault resistance $R_f$ in the evaluation unit in accordance with:

$$R_f = R_E \cdot \frac{(U_{ix} - U_{REx})^2 + (U_{iy} - U_{REy})^2}{U_{ix} \cdot U_{REx} + U_{iy} \cdot U_{REy} - (U_{REx}^2 + U_{REy}^2)}$$

2. A device for carrying out the method as claimed in claim 1, wherein a) the injection voltage is fed into a star point from an injection signal source via an injection transformer, a parallel resistor and the ground resistor; and b) a measuring transformer, whose output is connected to the input of the numerical evaluation unit, is provided in parallel with the ground resistor.

3. The device as claimed in claim 2, wherein the ground resistor and the parallel resistor are connected to the star point via a grounding transformer.

4. A device for carrying out the method as claimed in claim 1, wherein a) the injection voltage is fed into the conductors from an injection signal source via an injection transformer, a parallel resistor, the ground resistor and a grounding transformer; and b) a measuring transformer, whose output is connected to the input of the numerical evaluation unit, is provided in parallel with the ground resistor.

5. A method for detecting ground faults on conductors of an electrical machine, the method comprising the steps of:

a) biasing the conductors with respect to ground potential by means of a low-frequency injection voltage $U_i$ of frequency $f_1$, and measuring and evaluating a measuring voltage $U_{RE}$ via a ground resistor $R_E$ connected to the conductors;

b) calculating a ground fault resistance $R_f$ from the injection voltage $U_i$ and the measuring voltage $U_{RE}$, and numerically displaying said ground fault resistance $R_f$ in a numerical evaluation unit connected to the measuring voltage, the conductors being the rotor windings of said electrical machine and said injection voltage $U_i$ being fed into the terminals of the rotor windings via coupling capacitors;

c) dividing the injected and measured voltages $U_i$ and $U_{RE}$ in the evaluation orthogonal components $U_{ix}$, $U_{iy}$, and $U_{REx}$, $U_{REy}$, respectively; and d) calculating the ground fault resistance $R_f$ in the evaluation unit in accordance with:

$$R_f = R_E \cdot \frac{(U_{ix} - U_{REx} - U_{Ckx})^2 + (U_{iy} - U_{REy} - U_{Cky})^2}{U_{ix} \cdot U_{REx} + U_{iy} \cdot U_{REy} - (U_{REx}^2 + U_{REy}^2)}$$

where $U_{Ckx}$ and $U_{Cky}$ represent orthogonal components of a voltage $U_{Ck}$ measured over said coupling capacitors.

6. A device for carrying out the method as claimed in claim 5, wherein a) the injection voltage is fed into the rotor terminals from an injection signal source via an injection transformer, a parallel resistor, the ground resistor and two coupling capacitors; and b) a measuring transformer, whose output is connected to the input of the numerical evaluation unit, is provided in parallel with the ground resistor.

* * * * *